United States Patent [19]
Suzuki et al.

[11] Patent Number: 5,357,232
[45] Date of Patent: Oct. 18, 1994

[54] MAGNETOSTRICTIVE ELEMENT

[75] Inventors: Kazutaka Suzuki; Teruo Mori, both of Chiba, Japan

[73] Assignee: TDK Corporation, Tokyo, Japan

[21] Appl. No.: 984,554

[22] Filed: Dec. 2, 1992

[30] Foreign Application Priority Data

Dec. 12, 1991 [JP] Japan ............... 3-351481

[51] Int. Cl.⁵ ............... H01F 7/00; G04F 5/00; H04R 25/00; H01L 41/06
[52] U.S. Cl. ............... 335/215; 367/156; 367/168; 381/190; 310/26; 73/570
[58] Field of Search ............... 335/215; 367/156, 168; 381/190; 310/26; 73/570, 576

[56] References Cited

U.S. PATENT DOCUMENTS

| | | | |
|---|---|---|---|
| 2,435,487 | 2/1948 | Adler | 367/168 |
| 3,256,738 | 6/1966 | Giacomo | 367/156 |
| 3,274,540 | 9/1966 | Melhart | 367/168 |
| 3,283,184 | 11/1966 | Brown | 310/26 |
| 3,346,841 | 10/1967 | Weichart | 367/156 |
| 3,939,448 | 2/1976 | Garshelis | 335/215 |
| 4,845,450 | 7/1989 | Porzio et al. | |

FOREIGN PATENT DOCUMENTS

| | | | |
|---|---|---|---|
| 0169086 | 7/1991 | Japan | 310/26 |
| 168483 | 9/1959 | Switzerland | 310/26 |

*Primary Examiner*—Leo P. Picard
*Assistant Examiner*—Stephen T. Ryan
*Attorney, Agent, or Firm*—Oblon, Spivak, McClelland, Maier & Neustadt

[57] ABSTRACT

A magnetostrictive element includes a magnetostrictive member, an outer magnet disposed coaxially about, spaced apart from, and surrounding the magnetostrictive member, and a soft magnetic yoke for magnetically coupling the magnetostrictive member and the outer magnet to form a closed magnetic circuit. The magnetostrictive member may be either solid or hollow. In the latter case, an inner magnet is disposed coaxially within the magnetostrictive member for producing a biased DC magnetic field. An axial length of the outer magnet is made shorter than an axial length of the magnetostrictive member. In either case, the outer magnet is spaced apart from the magnetostrictive member so that a more uniform magnetization distribution is produced in the magnetostrictive member.

6 Claims, 6 Drawing Sheets

MAGNETOSTRICTIVE ELEMENT

BACKGROUND OF THE INVENTION

1. Field of the Invention

This invention relates to magnetostrictive elements such as magnetostrictive oscillators, actuators, and sensors.

2. Prior Art

Magnetostrictive materials not only undergo deformation or strain upon application of a magnetic field, but also have the reverse magnetostriction effect, known as Hilary effect, that they develop a magnetic field when deformed. There are various proposed active and passive elements utilizing magnetostrictive properties, for example, magnetostrictive oscillators, actuators, and sensors. In particular, $RFe_2$ Laves structure intermetallic compounds as typified by $TbFe_2$ are known as giant-magnetostrictive materials because of their extremely increased magnetostriction. Great attention is now paid to magnetostrictive elements using giant-magnetostrictive materials.

In general, these magnetostrictive elements have the following structure and performance.

A magnetostrictive sensor includes a magnetostrictive member and a magnet which are generally arranged in series and in close contact for producing a biased magnetic field. A coil is wound around the assembly. When the magnetostrictive sensor receives external vibration, impact, or any force that deforms the magnetostrictive member, electric current is induced in the coil due to Hilary effect. By measuring the current flow or voltage across the coil, the force applied to the sensor can be determined.

A magnetostrictive oscillator or actuator includes a magnetostrictive member, a magnet and a coil arranged in the same fashion as the magnetostrictive sensor. Alternating current, pulse current or direct current is applied to the coil to produce a magnetic field. Utilizing the vibration or deformation caused by the magnetic field, the element performs as an oscillator or actuator. Magnetostrictive elements of this construction can also be used as acoustic elements.

In these magnetostrictive elements, the closed magnetic circuit can be configured as desired by inserting a magnetic material yoke in series and contact with the magnetostrictive member and the magnet.

As the applied magnetic field changes in intensity, a magnetostrictive member changes its magnetostriction quantity. However, the resultant deformation is not in proportion to the applied magnetic field. Thus, a DC biased magnetic field is often applied to the element in order that the region where maximum deformation is exerted relative to a change in the applied magnetic field intensity is utilized in the case of magnetostrictive oscillators or actuators, and in order that the deformation of the magnetostrictive member changes linearly relative to a change in the applied magnetic field intensity in the case of magnetostrictive sensors.

A DC biased magnetic field is applied by various techniques, for example, by conducting direct current across the coil or using a magnet. In the DC conduction technique, the biased magnetic field can be readily changed in intensity by changing the magnitude of the current. However, where direct current is overlappingly applied across the coil across which alternating current is applied for driving the magnetostrictive member, chokes, capacitors and other components are necessary in order to avoid any interference between the AC and DC sources. This complicates the construction and increases the size of the element. It is possible to provide a magnetostrictive member driving coil and a biased magnetic field producing coil separately although this also results in an element having complicated construction and an increased size.

On the other hand, the use of a magnet for producing a biased magnetic field ensures a compact magnetostrictive element of simple construction.

Giant-magnetostrictive materials as mentioned above have low magnetic permeability. If a magnet is used to apply a biased magnetic field to a magnetostrictive member of giant-magnetostrictive material, then the magnetostrictive member exhibits a substantially uneven magnetization distribution that magnetic susceptibility is high in regions near the magnet, but drastically lowers in remoter regions. This means that the member is magnetized to optimum intensity in some regions, but insufficiently in other regions, failing to increase the overall efficiency of the magnetostrictive member.

SUMMARY OF THE INVENTION

Therefore, an object of the present invention is to provide a magnetostrictive element of the type using a magnet for applying a biased magnetic field to a magnetostrictive member wherein the magnetostrictive member has an improved even magnetization distribution.

According to one aspect of the present invention, there is provided a magnetostrictive element comprising a generally cylindrical magnetostrictive member containing a rare earth metal element and iron. The member may be a hollow or solid cylinder. A generally cylindrical hollow outer magnet is disposed coaxially about the magnetostrictive member so as to surround the member. The outer magnet is radially spaced apart from the magnetostrictive member, that is, a space is left between the magnetostrictive member and the outer magnet. The magnetostrictive member and the outer magnet are magnetically coupled by soft magnetic yoke means to form a closed magnetic circuit. In one preferred embodiment, a generally cylindrical inner magnet is disposed inside the hollow magnetostrictive member for producing a biased magnetic field. The inner magnet forms part of the closed magnetic circuit.

In a second form of the invention, the magnetostrictive element includes a generally cylindrical hollow magnetostrictive member containing a rare earth metal element and iron. A generally cylindrical hollow outer magnet is disposed coaxially about the magnetostrictive member so as to surround the member. The outer magnet is radially spaced apart from the magnetostrictive member, that is, a space is left between the magnetostrictive member and the outer magnet. A cylindrical inner magnet is disposed coaxially within the magnetostrictive member for producing a biased magnetic field. The magnetostrictive member and the inner magnet are magnetically coupled by soft magnetic yoke means to form a closed magnetic circuit.

In either form, the axial length of the outer magnet is preferably shorter than the axial length of the magnetostrictive member.

ADVANTAGES

Figure 5:
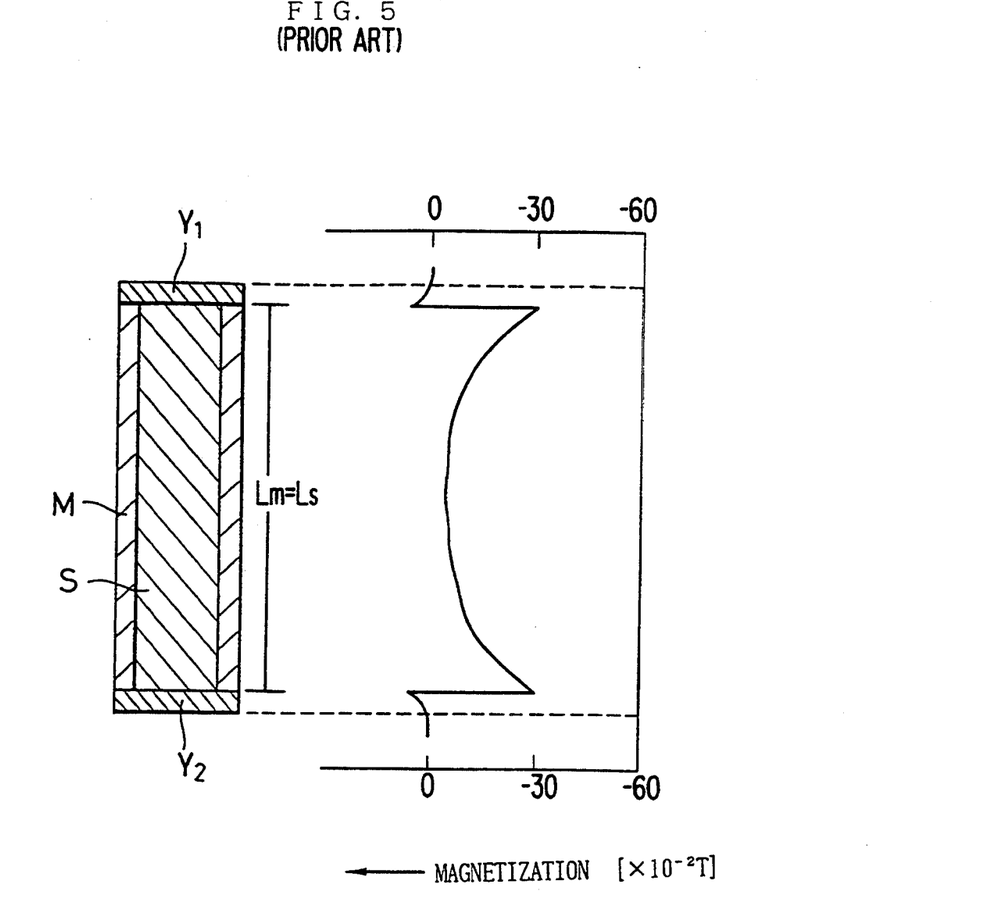
FIGS. 5 and 6 are schematic cross sectional views of prior art magnetostrictive elements, with a diagram of the magnetization distribution in a magnetostrictive member drawn at the right.
Figure 6:
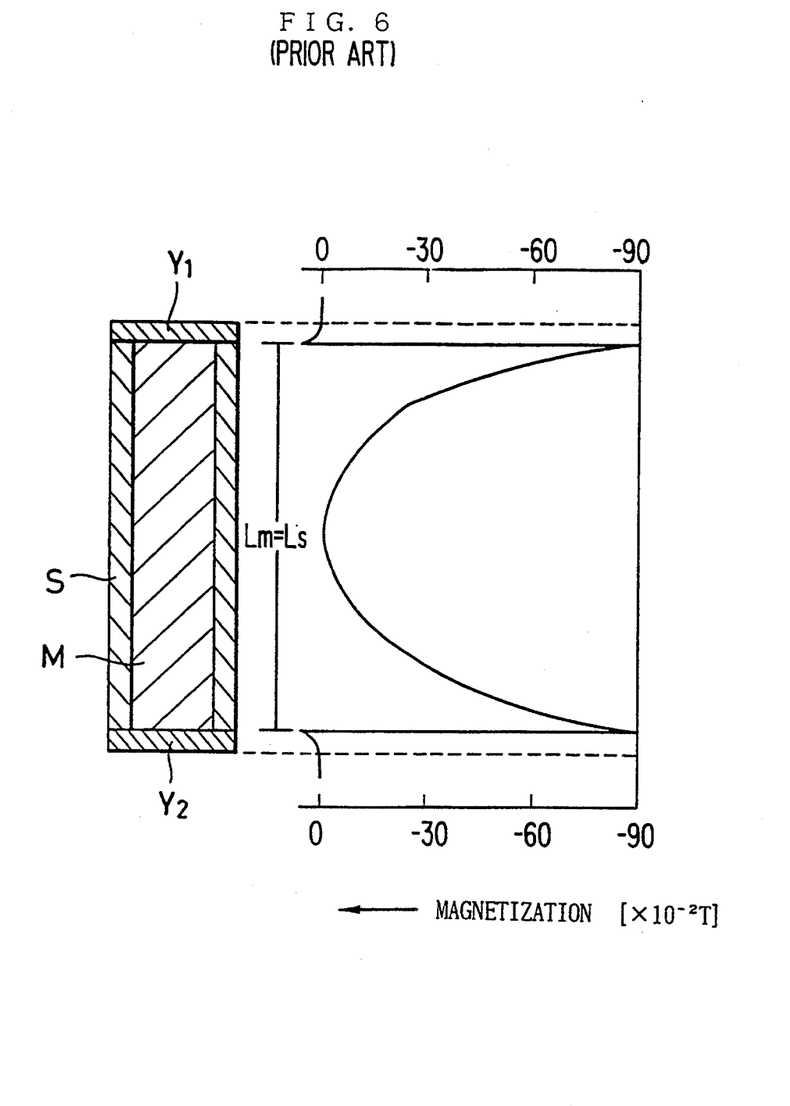

A magnetostrictive element includes a magnetostrictive member and a cylindrical magnet coaxially disposed around the magnetostrictive member, which are magnetically coupled by soft magnetic yokes for applying a biased magnetic field to the magnetostrictive member. Insofar as the element of this type for applying a biased magnetic field is concerned, structures as shown in FIGS. 5 and 6 are known in the prior art. More particularly, in FIGS. 5 and 6, a magnet M for producing a biased magnetic field is closely disposed outside or inside a magnetostrictive member S. They are magnetically coupled by a pair of soft magnetic yokes Y1 and Y2 to form a closed magnetic circuit. Since no space is left between the magnetostrictive member S and the magnet M, the member exhibits high magnetic susceptibility at opposite ends and low magnetic susceptibility at the center as seen from the magnetization curve at the right of each figure, that is, uneven magnetization.

Figure 1:
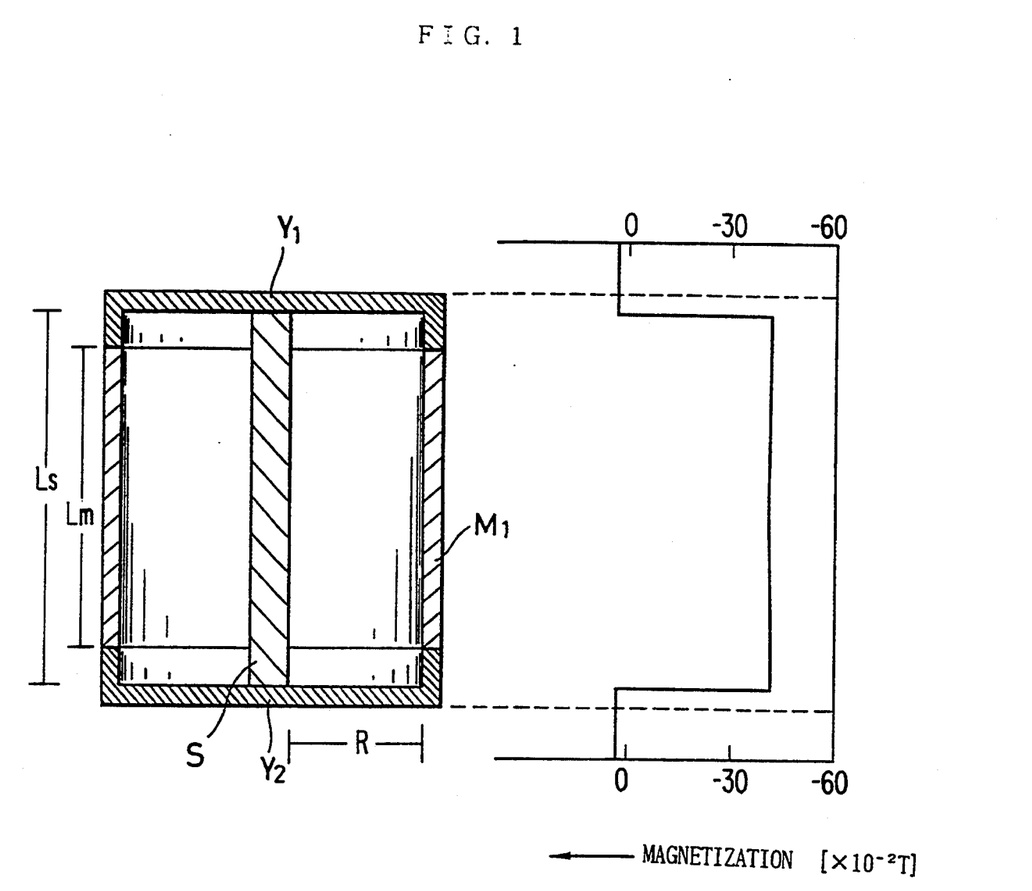
FIGS. 1 to 4 are schematic cross sectional views of magnetostrictive elements according to several preferred embodiments of the present invention, with a diagram of the magnetization distribution in a magnetostrictive member drawn at the right.
Figure 2:
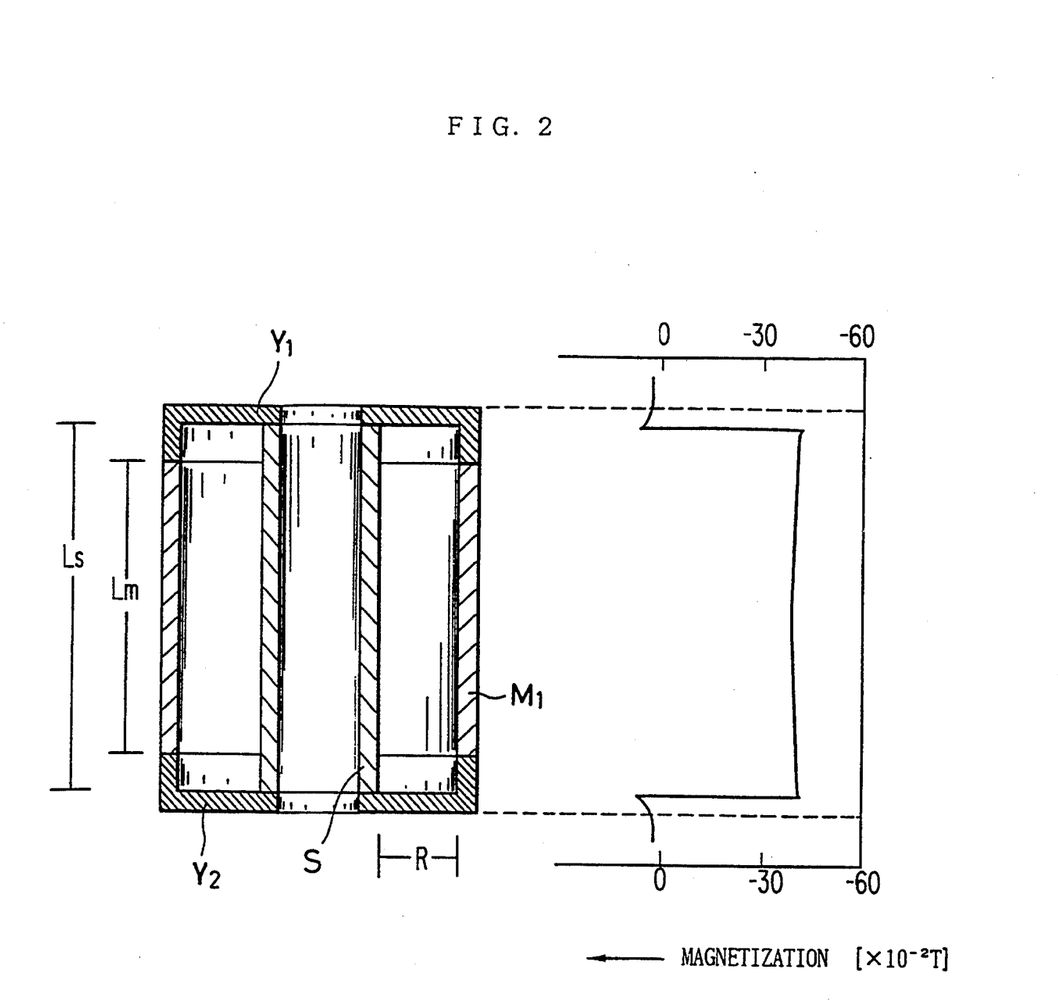
Figure 3:
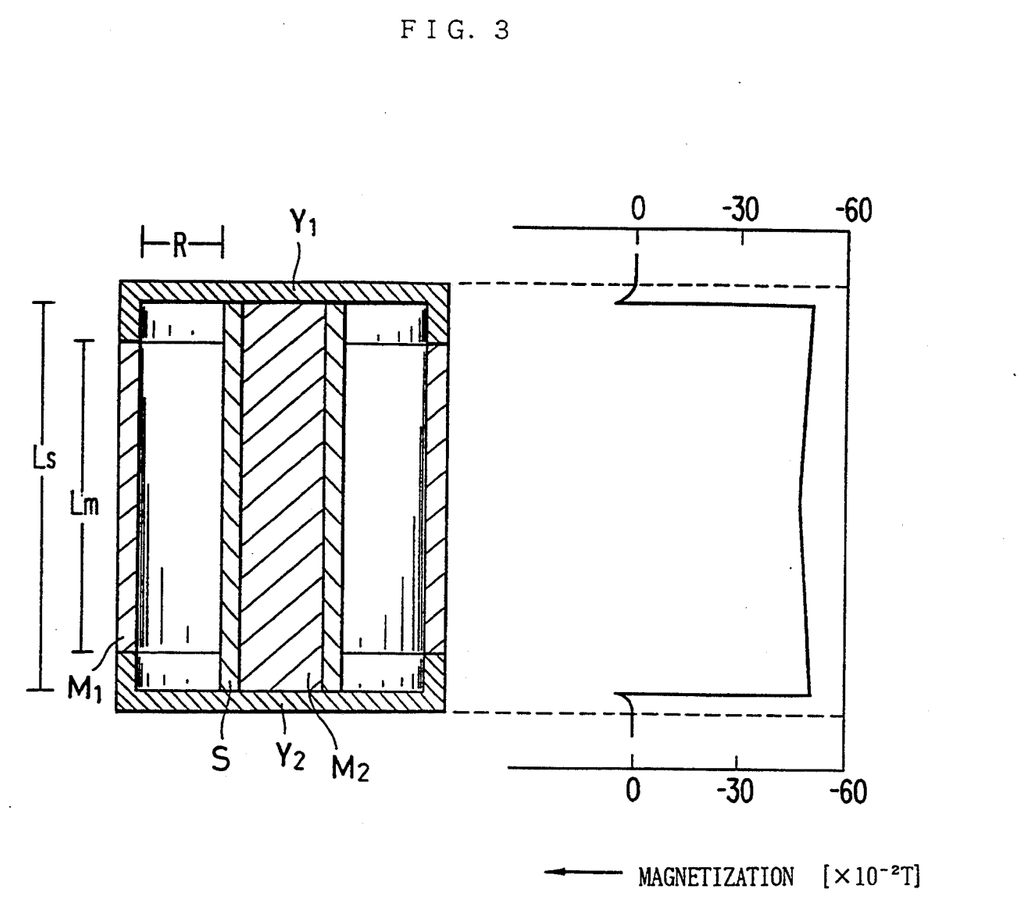

In contrast, the magnetostrictive element of the invention requires that, as shown in FIGS. 1 and 2, an outer magnet M1 is disposed outside a magnetostrictive member S via a space whereby the magnet M1 not only applies a biased magnetic field to the magnetostrictive member S, but also improves the magnetization distribution in the member S, thereby accomplishing more even magnetization. The advantage is enhanced by disposing an inner magnet M2 within the hollow magnetostrictive member S for producing a biased magnetic field as shown in FIG. 3 wherein the inner magnet M2 is also magnetically coupled with the member S by soft magnetic yokes Y1 and Y2.

Figure 4:
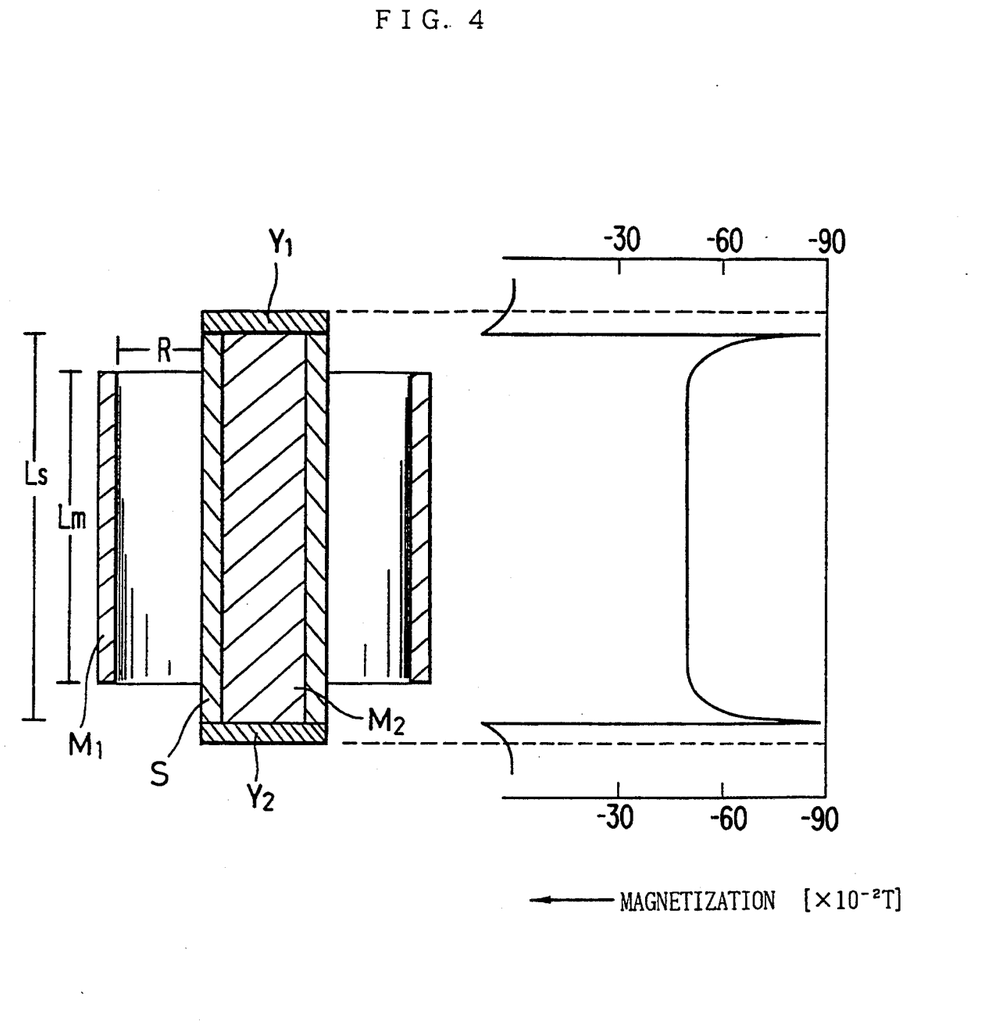

In the second form, as shown in FIG. 4, an inner magnet M2 for producing a biased magnetic field is disposed inside a hollow cylindrical magnetostrictive member S. The inner magnet M2 and the magnetostrictive member S are magnetically coupled by a pair of soft magnetic yokes Y1 and Y2 to form a closed magnetic circuit. An outer magnet M1 for improving magnetization distribution is disposed outside the closed magnetic circuit via a space.

The evenness of magnetization distribution in the magnetostrictive member is significantly improved by each of the constructions shown in FIGS. 1 to 4. This magnetization distribution flattening is further improved when the magnet M1 is shorter than the magnetostrictive member S. The magnet for improving magnetization distribution is also effective for preventing magnetic flux leakage from an intermediate portion of the magnetostrictive member.

BRIEF DESCRIPTION OF THE DRAWINGS

These and other features and advantages of the present invention will be better understood by reading the following description taken in conjunction with the accompanying drawings.

DETAILED DESCRIPTION OF THE INVENTION

In the first form of the present invention, the magnetostrictive element includes a generally cylindrical, hollow or solid, magnetostrictive member, a generally cylindrical hollow outer magnet disposed coaxially about the magnetostrictive member so as to surround the member, and a soft magnetic yoke means. The magnetostrictive member, the outer magnet and the yoke means form a closed magnetic circuit. The outer magnet is radially spaced apart from the magnetostrictive member, that is, a space is left between the magnetostrictive member and the outer magnet. Preferably, the axial length of the outer magnet is shorter than the axial length of the magnetostrictive member.

FIGS. 1 and 2 illustrate preferred embodiments of the magnetostrictive element. The magnetostrictive element 1 shown in FIGS. 1 and 2 includes a cylindrical magnetostrictive member S having an axial length and a cylindrical hollow outer magnet M1 having an axial length. The outer magnet M1 is disposed coaxially around and radially spaced apart from the magnetostrictive member S. The outer magnet axial length is shorter than the magnetostrictive member axial length. The difference between the FIGS. 1 and 2 is that the magnetostrictive member S is solid in FIG. 1 and hollow in FIG. 2. A pair of soft magnetic yokes Y1 and Y2 are attached to the axially opposed ends of the magnetostrictive member S and the outer magnet M1 for coupling them magnetically to form a closed magnetic circuit. In the illustrated embodiments, each yoke is a disk of the same diameter as the cylindrical magnet M1 having an axially protruding circumferential flange along the outer periphery. The magnetostrictive member S is attached to each yoke Y1 or Y2 at its center and the outer magnet M1 is attached to the yoke flange.

In the magnetostrictive element, the outer magnet M1 is effective for suppressing magnetic flux leakage from the magnetostrictive member S of low magnetic permeability, especially at an axially intermediate portion thereof, thereby improving the evenness of magnetization distribution in the member S. Since the outer magnet M1 and the magnetostrictive member S are magnetically coupled by the soft magnetic yokes Y1 and Y2 to form a closed magnetic circuit, the magnet M1 is also effective for applying a biased magnetic field to the magnetostrictive member S.

In the embodiment of FIG. 2 wherein the magnetostrictive member S is a hollow cylinder, a cylindrical, hollow or solid, inner magnet may be disposed inside the member for producing a biased magnetic field. The inner magnet is also coupled to the magnetostrictive member by the soft magnetic yokes to form part of the closed magnetic circuit. Such a preferred embodiment of magnetostrictive element is shown in FIG. 3. The magnetostrictive element shown in FIG. 3 is of substantially the same structure as the element of FIG. 2. A cylindrical solid inner magnet M2 is coaxially disposed within the magnetostrictive member S for producing a biased magnetic field. The yokes Y1 and Y2, magnetostrictive member S, and magnets M1 and M2 form a closed magnetic circuit. This arrangement is useful where an intense biased magnetic field is required since both the magnets M1 and M2 apply biased magnetic fields to the magnetostrictive member S.

In the second form of the invention, the magnetostrictive element includes a generally cylindrical hollow magnetostrictive member, a generally cylindrical hollow outer magnet disposed coaxially about the magnetostrictive member, a generally cylindrical inner magnet disposed coaxially within the magnetostrictive member for producing a biased magnetic field, and soft magnetic yoke means. The magnetostrictive member, the inner magnet and the yoke means form a closed magnetic circuit. The outer magnet is spaced apart from the magnetostrictive member, that is, a space is left between the magnetostrictive member and the outer magnet. Preferably, the axial length of the outer magnet is shorter than the axial length of the magnetostrictive member.

One preferred embodiment of magnetostrictive element is shown in FIG. 4. The magnetostrictive element shown in FIG. 4 includes a hollow cylindrical magnetostrictive member S having an axial length and a cylindrical hollow outer magnet M1 having an axial length. The outer magnet M1 is radially spaced apart from the magnetostrictive member S. The outer magnet axial length is shorter than the magnetostrictive member axial length. A generally cylindrical inner magnet M2 is disposed coaxially within the magnetostrictive member S for producing a biased magnetic field. A pair of soft magnetic yokes Y1 and Y2 are attached to the axially opposed ends of the magnetostrictive member S and the inner magnet M2 for magnetically coupling them to form a closed magnetic circuit. In the illustrated embodiments, each yoke is a disk of the same diameter as the member S. It will be understood that the embodiment of FIG. 4 is different from the embodiment of FIG. 3 in that the magnetostrictive member S and the outer magnet M1 is not magnetically coupled by the soft magnetic yokes Y1 and Y2 and a biased magnetic field is applied by only the inner magnet M2.

As seen from FIGS. 1 to 4, the magnetostrictive element of the present invention includes the space defined between the outer surface of the magnetostrictive member S and the inner surface of the outer magnet M1 for improving magnetization distribution. This space is effective for improving the evenness of magnetization distribution in the member S. The spacing between the magnetostrictive member S and the outer magnet M1 may be determined, so as to achieve a more uniform magnetization distribution, in accordance with the dimensions and properties of the member S and magnet M1 and the presence or absence of soft magnetic yokes therebetween or by an experimental procedure. Provided that R is the spacing between the magnetostrictive member S and the outer magnet M1 and Ls is the axial length of the magnetostrictive member S, the spacing R is preferably determined relative to the member axial length Ls to meet the relationship: $0.2 \leq R/Ls$. The upper limit of R/Ls is not particularly limited although $R/Ls \leq 0.6$ is preferred for compactness. Better results are obtained within the range: $0.2 \leq R/Ls \leq 0.6$.

The magnetostrictive member S has an axial length Ls and the outer magnet M1 has an axial length Lm. Better results are obtained when the magnet axial length Lm is shorter than the member axial length Ls, that is, Lm<Ls. The ratio Lm/Ls is not particularly limited and may be determined in accordance with the spacing between magnet M1 and member S, the presence or absence of the magnetic coupling by soft magnetic yokes, the presence or absence of inner magnet M2, the magnetic properties and dimensions of these components, the magnetic permeability of member S, and the like. Preferably, Lm/Ls<1, more preferably $0.6 \leq Lm/Ls \leq 0.95$.

Since the magnetostrictive member S axially expands and contracts upon application of a magnetic field, at least one of the soft magnetic yokes Y1 and Y2 is not fixedly secured to the member S, but is provided with a center recess for receiving a corresponding end of the member S for axial sliding motion.

In the embodiments of FIGS. 1 to 4, the magnetostrictive member S, outer magnet M1, and inner magnet M2 are cylinders which may be either hollow or solid and either circular or polygonal in cross section. A choice may be made in accordance with the intended application and requirements of a magnetostrictive element.

Often, the magnetostrictive element of the invention is provided with a coil (not shown). The coil is generally arranged to surround the magnetostrictive member and the outer magnet. Where the magnetostrictive element is used as an oscillator or actuator, AC, DC or pulse current is conducted across the coil to produce a magnetic field around the member. For the magnetostrictive element used as a sensor, upon receipt of external vibration, impact or any force that deforms the member, electric current is induced in the coil due to Hilary effect. The force applied to the sensor can be determined by measuring the current flow or voltage across the coil.

The magnetostrictive member is formed of a material containing a rare earth metal element and iron. This magnetostrictive material has an increased magnetostriction quantity so that it may be applied to either active elements such as magnetostrictive actuators or positive elements such as magnetostrictive sensors.

The composition of magnetostrictive material is not particularly limited. Preferably, it has a magnetostriction quantity $\Delta l/l$ of at least 1,000 ppm in a DC magnetic field of 1 kOe. Magnetostrictive elements of better performance can be fabricated using a composition of the formula:

$$RT_x$$

wherein R is at least one rare earth metal element inclusive of yttrium (Y), T is Fe which may be partially replaced by Ni and/or Co, and x is $1.5 \leq x \leq 2.5$, preferably $1.85 \leq x \leq 2.00$. With x outside the range, the magnetostriction quantity in a high magnetic field and a magnetostriction change $d\lambda/dH$ per unit magnetic field intensity become low.

Examples of the rare earth metal elements include lanthanides, such as La, Nd, Pr, Ce, Sm, Gd, Tb, Eu, Dy, Ho, Er, Yb, Lu, and Tm. Preferred are Sm Tb, Dy, Ho, Er and Tm alone as well as TbGd, TbDy, TbHo, TbHoDy, SmTb, SmDy, SmHo, SmEr, and SmHoDy which alloys may further contain at least one member of Ho, Er and Dy. Among these, Tb alone, Tb partially replaced by Dy and/or Ho, Sm alone, and Sm partially replaced by Dy and/or Ho are especially preferred because of a satisfactory magnetostriction quantity in high and low magnetic fields at room temperature. Materials containing Tb exhibit positive magnetostriction and materials containing Sm exhibit negative magnetostriction. In the composition, another transition metal element, Zn or the like may be contained in an amount of up to 30 atom % of the entire composition. The other transition metal elements include Sc, Ti, V, Cr, Mn, Cu, Y, Zr, Nb, Mo, Tc, Ru, Rh, Pd, Ag, Cd, Hf, Ta, W, Re, Os, Ir, Pt, Au and Hg.

Such magnetostrictive materials are disclosed in U.S. Pat. Nos. 3,949,351, 4,152,178, 4,308,474, 4,375,372 and 4,378,258, and Japanese Patent Application Kokai No. 64798/1978 as well as Japanese Patent Application Nos. 172376/1987, 227962/1987, 227963/1987, 284133/1988, 284134/1988 and 41171/1989 by the assignee of the present invention.

The magnetostrictive member may be prepared by conventional alloy preparation techniques, for example, arc melting, unidirectional solidification, zone melting, high-frequency melting, and powder metallurgy techniques and shaped and worked to a desired shape and dimensions.

The composition of outer and inner magnets is not particularly limited and may be selected from rare earth magnets such as Sm-Co and Nd-Fe-B magnets and various ferrite magnets in accordance with a required magnetic field intensity.

Also the yokes may be formed of any desired material, preferably soft magnetic materials having a high saturation magnetic flux density and high magnetic permeability, for example, carbon steel such as S45C.

EXAMPLE

Examples of the present invention are given below by way of illustration and not by way of limitation.

Magnetostrictive elements of the structures shown in FIGS. 1 to 6 were fabricated. In each figure, S is a magnetostrictive member, M1 is an outer magnet for improving magnetization distribution or for improving magnetization distribution and producing a biased magnetic field, M2 is an inner magnet for producing a biased magnetic field, and Y1 and Y2 are yokes. The magnetostrictive member and the magnets had a circular cross section. FIGS. 1 to 4 are examples within the scope of the invention.

FIGS. 5 and 6 are comparative examples. The magnet M in the magnetostrictive elements of FIGS. 5 and 6 is in close contact with the magnetostrictive member S and effective for producing a biased magnetic field, but not for improving magnetization distribution.

Each figure shows the dimensions of the respective components along with the ratio of the axial length Lm of outer magnet M1 to the axial length Ls of magnetostrictive member S, Lm/Ls. The unit is mm. In the cross-sectional views, the transverse dimensions are not drawn to scale while the magnetization curve diagram at the right is coincident with the dimensional proportion in the axial direction.

The magnetostrictive member was formed of $Tb_{0.3}Dy_{0.7}Fe_{1.95}$ by a zone melting technique. The magnets were rare earth magnets NEOREC 30 UH (manufactured by TDK Corporation). The yokes were of carbon steel S45C.

For these magnetostrictive elements, magnetization distribution was determined along the axis of the magnetostrictive member by simulation and drawn at the right of each figure. The position at which magnetization distribution was measured was on the axis of the magnetostrictive member when it was a solid cylinder and on a straight line passing the center of the circumferential wall of the magnetostrictive member in parallel with the axis of the member when it was a hollow cylinder. The simulation used a magnetic field analysis program "MAGNA FIM" based on the finite element method.

The advantages of the present invention are evident from the magnetization curve diagrams of the figures. The magnetostrictive elements of FIGS. 1 to 4 within the scope of the invention are improved in uniformity of magnetization distribution in the magnetostrictive member over the comparative elements of FIGS. 5 and 6.

There has been described a magnetostrictive element in which a magnetostrictive member is spaced apart from a permanent magnet for producing a biased magnetic field whereby a more uniform magnetization distribution is available in the member. Thus an optimum biased magnetic field is applicable throughout the magnetostrictive member, resulting in more efficient utilization of the magnetostrictive member.

Although some preferred embodiments have been described, many modifications and variations may be made thereto in the light of the above teachings. It is therefore to be understood that within the scope of the appended claims, the invention may be practiced otherwise than as specifically described.

We claim:

1. A magnetostrictive element comprising:
    a generally cylindrical magnetostrictive member containing a rare earth metal element and iron;
    a generally cylindrical hollow outer magnet disposed coaxially about, spaced apart from, and surrounding said magnetostrictive member; and
    soft magnetic yoke means for magnetically coupling said magnetostrictive member and said outer magnet to form a closed magnetic circuit therebetween, wherein an axial length of said outer magnet is shorter than an axial length of said magnetostrictive member.

2. A magnetostrictive element according to claim 1, wherein said magnetostrictive member is hollow and said magnetostrictive element further includes a generally cylindrical inner magnet disposed coaxially within said magnetorestrictive member for generating a biased magnetic field, said inner magnet forming part of said closed magnetic circuit, and an axial length of said outer magnet being shorter than an axial length of said magnetostrictive member.

3. A magnetostrictive element comprising:
    a generally cylindrical hollow magnetostrictive member containing a rare earth metal element and iron;
    a generally cylindrical hollow outer magnet disposed coaxially about, spaced apart from, and surrounding said magnetostrictive member;
    a generally cylindrical inner magnet, disposed coaxially within said magnetostrictive member, for generating a biased magnetic field; and
    soft magnetic yoke means for magnetically coupling said magnetostrictive member and said inner magnet to form a closed magnetic circuit therebetween, wherein an axial length of said outer magnet is shorter than an axial length of said magnetostrictive member.

4. A magnetostrictive element according to claim 1, wherein a ratio of an axial length of said outer magnet to an axial length of said magnetostrictive member is in the range of 0.6 to 0.95.

5. A magnetostrictive element according to claim 2, wherein a ratio of an axial length of said outer magnet to an axial length of said magnetostrictive member is in the range of 0.6 to 0.95.

6. A magnetostrictive element according to claim 3, wherein a ratio of an axial length of said outer magnet to an axial length of said magnetostrictive member is in the range of 0.6 to 0.95.

* * * * *